United States Patent
Gardner et al.

[11] Patent Number: 6,046,471
[45] Date of Patent: *Apr. 4, 2000

[54] ULTRA SHALLOW JUNCTION DEPTH TRANSISTORS

[75] Inventors: Mark I. Gardner, Cedar Creek; Fred N. Hause; Daniel Kadosh, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/744,405

[22] Filed: Nov. 7, 1996

[51] Int. Cl.$^7$ .................................................. H01L 31/119
[52] U.S. Cl. .................... 257/336; 257/344; 257/374; 257/389; 257/401; 257/408; 438/163; 438/217; 438/231
[58] Field of Search ...................................... 438/300–301, 438/163, 217, 231; 257/344, 408, 336, 900, 374, 389, 401

[56] References Cited

U.S. PATENT DOCUMENTS

| | | | |
|---|---|---|---|
| 4,803,176 | 2/1989 | Bower | 438/300 |
| 4,948,745 | 8/1990 | Pfiester et al. | 438/300 |
| 5,079,180 | 1/1992 | Rodder et al. | 438/300 |
| 5,118,639 | 6/1992 | Roth et al. | 438/300 |
| 5,314,832 | 5/1994 | Deleonibus | 438/300 |
| 5,545,579 | 8/1996 | Liang et al. | |
| 5,597,746 | 1/1997 | Prall | 438/300 |
| 5,637,518 | 6/1997 | Prall et al. | 438/301 |
| 5,683,924 | 11/1997 | Chan et al. | |

OTHER PUBLICATIONS

Sze, S.M., *Physics of Semiconductor Devices*, Second Edition, John Wiley & Sons, 1981, pp. 431–486.

*Primary Examiner*—William Mintel
*Attorney, Agent, or Firm*—Conley, Rose & Tayon, P.C.; Robert C. Kowert; Kevin L. Daffer

[57] ABSTRACT

A shallow junction MOS transistor comprising a semiconductor substrate having an upper region that includes a first and a second lightly doped region laterally displaced on either side of the channel region. The first and second lightly doped regions extend to a junction depth below the upper surface of the semiconductor substrate. A first and a second lightly doped impurity distribution are located within the first and second source/drain regions of the semiconductor substrate. The shallow junction transistor further includes a gate dielectric formed on an upper surface of the channel region of the semiconductor substrate. A conductive gate that includes a first and a second sidewall is formed on the gate dielectric. A gate insulator is formed in contact with the first and second sidewalls of the conductive gate. First and second source/drain structures are formed above the upper surface of the semiconductor substrate. The first and second source/drain structures are laterally displaced over the first and second lightly doped regions of the semiconductor substrate.

46 Claims, 3 Drawing Sheets

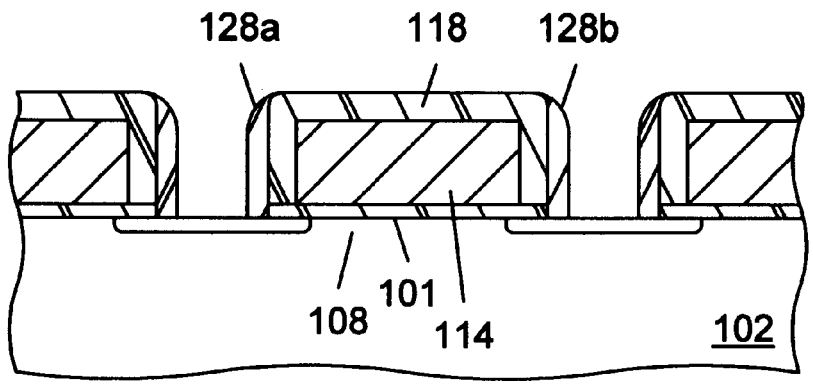
FIG. 7
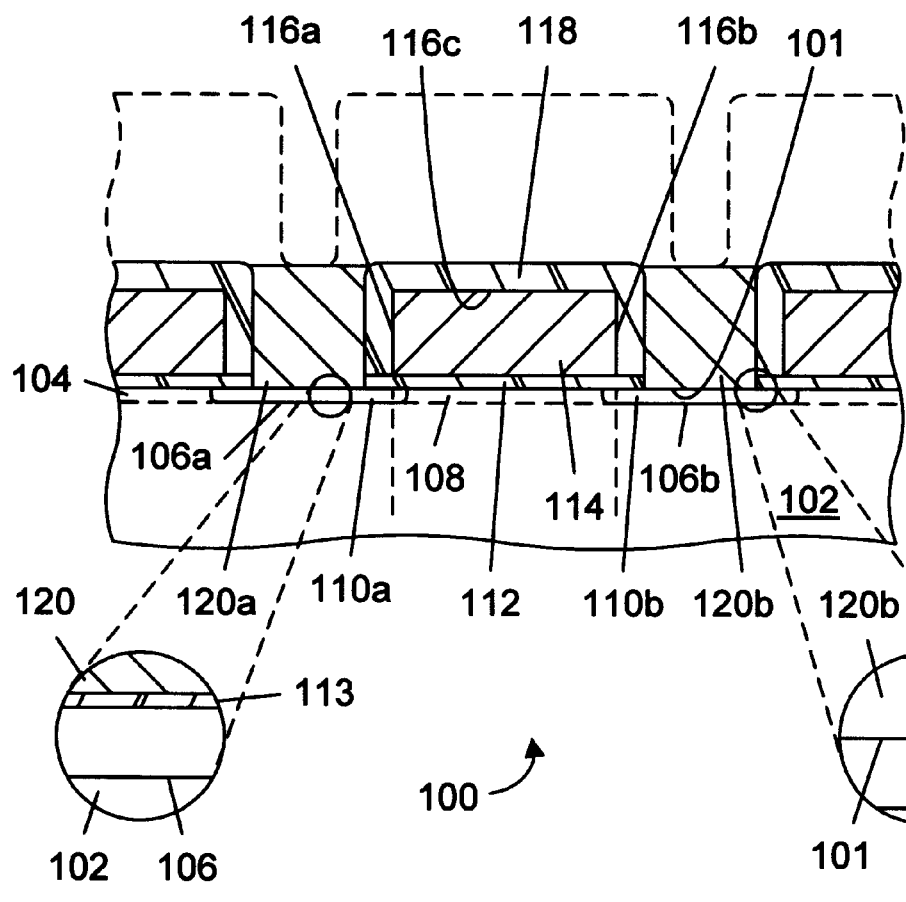
FIG. 8
FIG. 8b
FIG. 8a

ULTRA SHALLOW JUNCTION DEPTH TRANSISTORS

BACKGROUND OF THE INVENTION

1. Field of the Invention

The invention relates to the field of semiconductor fabrication and, more particularly, to a transistor having extremely shallow source/drain junction depths and a method for fabricating the transistors.

2. Description of the Related Art

NMOS Circuits are widely used in the electronics industry for an extremely broad range of applications including microprocessors, integrated circuit memories, and applications specific logic products. The basic building block of the NMOS integrated circuit is the MOS transistor. FIG. 1 shows a typical embodiment of a single MOS n-channel transistor. MOS transistor 10 includes a lightly doped p-type semiconductor substrate 12, a gate dielectric 16 formed on substrate 12, a conductive gate 14 formed on the gate dielectric, n-type source region 18, and n-type drain region 20. The operation and characteristics of transistor 10 are well known. With no bias applied to conductive gate 14, a reversed bias p-n junction exists between drain region 20 and channel region 22 such that the current flow from drain region 20 to source region 18 is negligible. If, however, a positive bias is applied to conductive gate 14, mobile carriers within channel region 22 of p-type substrate 12 are repelled from the surface leaving behind a depletion region of uncompensated donor ions. If conductive gate 14 is further biased, minority carriers (i.e. electrons) are attracted to channel region 22 of substrate 12 to form a conductive inversion region near the upper surface of semiconductor substrate 12 in channel region 22. The bias required to induce an electron concentration near the surface of substrate 12 approximately equal to the whole concentration in the bulk of semiconductor substrate 12 is referred to as the threshold voltage ($V_t$). With a threshold voltage $V_t$ applied to conductive gate 14, the conductive channel in channel region 22 permits current flow from drain region 20 to source region 18 if an appropriate bias is applied to drain region 20. For small values of drain voltage $V_d$ (i.e. $V_d < V_g - V_t$) the current ($I_{ds}$) that flows from drain region 20 to source region 18 varies approximately linearly with the drain voltage $V_d$. For large values of drain voltage (i.e. $V_d > V_g - V_t$), $I_{ds}$ is independent of $V_d$ to a first order approximation. Applying a gate $V_g$ that is less than the threshold voltage $V_t$ induces a weak inversion region is induced in channel region 22 of semiconductor substrate 12 permitting a small but measurable subthreshold current to flow from source to drain. Subthreshold currents are particularly important in low voltage, low power applications such as MOS integrated circuits because of the large number of transistors in the integrated circuit and because the subthreshold region determines the manner in which the transistors turn on and off.

MOS transistors may be broadly characterized as either short channel or long channel devices. In a long channel device, the sub-threshold current is independent of the drain voltage, the threshold voltage is independent of the channel length and the transistor biasing, and the drain current in the saturation region is independent of the drain voltage. It will be appreciated that these characteristics of long channel devices are desirable from a manufacturing and circuit design perspective because of their tendency to minimize subthreshold currents and threshold voltage variation among transistors of varying dimensions. In contrast to long channel devices, short channel devices are characterized by a subthreshold current that varies with drain voltage, a threshold voltage that varies with channel length and the biasing conditions, and a failure of current saturation in the saturation region. A useful equation has been derived that predicts the minimum channel length which can be expected to result in long channel subthreshold behavior for a given set of process parameters. See, e.g., S. M. Sze., *Physics of Semiconductor Devices* pp. 431–86 (John Wiley and Sons, 1981). A minimum channel length for long channel operation depends primarily upon the gate oxide thickness, the substrate doping, the drain voltage, and the junction depth of the source/drain regions. Sze, supra, at 471. Other parameters being equal, the minimum channel length for long channel operation varies with the cube root of the junction depth. As the channel length of MOS transistors has been reduced through advancements in photolithography and other semiconductor processing techniques, the significance of the subthreshold characteristics and the efforts to minimize subthreshold effects have been correspondingly increased. Unfortunately, the conventional methods of forming source region 18 and drain region 20 of transistor 10 have provided a source of frustration for process designers attempting to minimize short channel effects. Typically, source region 18 and drain region 20 of transistor 10 are fabricated by an ion implantation technique in which ions of appropriate impurities, or boron are implanted into semiconductor substrate 12. Even when used in conjunction with a dielectric layer formed on the surface prior to the implantation, the ion implantation process typically results in a junction depth x that places a lower limit on the minimum channel device that can be fabricated with long channel characteristics. In addition, processing subsequent to the ion implantation process typically redistributes the ion implantation distributions such that the as implanted junction depth is less than the junction depth that exists at the completion of the fabrication process. Accordingly, efforts to minimize short channel effects in MOS transistors in the submicron range have been greatly constrained by the minimum junction depth x typically available with the standard MOS transistor formation process. It would therefore be highly desirable to implement a fabrication process in which the junction depth of the MOS transistor could be significantly reduced without undesirably altering other transistor parameters.

SUMMARY OF THE INVENTION

The problems outlined above are in large part addressed by a shallow junction MOS transistor and a method for making the same. The shallow junction transistor includes first and second source/drain structures formed above the upper surface of the semiconductor substrate laterally displaced on either side of a conductive gate. By forming the heavily doped source/drain regions within the source/drain structures above the upper surface of the semiconductor substrate the transistor, junction depth can be minimized. The heavily doped source/drain regions within the source/drain structures are coupled to the channel region of the transistor through a lightly doped impurity distribution located underneath the source/drain structures.

Broadly speaking, the present invention contemplates a shallow junction MOS transistor. The transistor includes a semiconductor substrate having an upper region that includes a first and a second lightly doped region laterally displaced on either side of the channel region. The first and second lightly doped regions extend to a junction depth below the upper surface of the semiconductor substrate. A first and a second lightly doped impurity distribution are located within the first and second source/drain regions respectively of the semiconductor substrate. The shallow junction transistor further includes a gate dielectric formed on an upper surface of the channel region of the semiconductor substrate. A conductive gate that includes a first and a second sidewall is formed on the gate dielectric. A gate insulator is formed in contact with the first and second sidewalls of the conductive gate. First and second source/drain structures are formed above the upper surface of the semiconductor substrate. The first and second source/drain structures are laterally displaced over the first and second lightly doped regions of the semiconductor substrate.

In a preferred embodiment the semiconductor substrate comprises single crystal silicon having a resistivity of approximately 10 to 15 Ω-cm. The junction depth of the first and second lightly doped regions is preferably less than approximately 0.1 microns. The channel region of the semiconductive substrate preferably extends from a position within the semiconductive substrate approximately coincident with a lateral position of the first sidewall of the conductive gate to a position approximately coincident with a lateral position of the second sidewall of the conductive gate. In the preferred embodiment, a peak concentration of the first and second lightly doped impurity distributions is less than approximately $1 \times 10^{17}$ atoms/cm$^3$. The first and second lightly doped impurity distributions typically comprise ions of boron, phosphorous or arsenic. The gate dielectric is suitably a thermal oxide having a thickness of approximately 20 to 200 angstroms. In one embodiment, the conductive gate includes polysilicon having a sheet resistivity less than approximately 500 Ω/square. In an alternative embodiment, the conductive gate comprises aluminum. In one embodiment, the gate insulator is a thermal oxide having a thickness of approximately 200 to 1000 angstroms. In an alternative embodiment, the gate insulator is a CVD dielectric. In a presently preferred embodiment, the first and second source/drain structures are heavily doped polysilicon (i.e., the polysilicon includes an impurity distribution with a peak concentration greater than approximately $1 \times 10^{19}$ atoms/cm$^3$). In one embodiment, a source/drain dielectric separates the first and second source/drain structures from the first and second lightly doped regions of the semiconductor substrate. In this embodiment, a preferred thickness of the source/drain dielectric is between approximately 30 to 50 angstroms. In one embodiment, the transistor further includes a first and second silicon nitride spacer in contact with the first and second sidewall of the gate insulator. A preferred thickness of the first and second silicon nitride spacer is approximately 200 to 1000 angstroms.

The present invention further contemplates a semiconductor manufacturing process. The process includes providing a semiconductor substrate having an upper region including a first and a second lightly doped region. The first and second lightly doped regions are laterally displaced on either side of a channel region of the semiconductor substrate. The first and second lightly doped regions extend to a junction depth below the upper surface of the semiconductor substrate. A gate dielectric is then formed on the upper surface of the substrate and a conductive gate is formed on the upper surface of the gate dielectric. The conductive gate is laterally displaced over the channel region of the semiconductor substrate. A gate insulator is then formed in contact with a first and second sidewall of the conductive gate. Thereafter, first and second source/drain structures are formed above the upper surface of the semiconductor substrate laterally displaced over the first and second lightly doped regions of the semiconductor substrate. The first and second source/drain structures include a source/drain impurity distribution.

Preferably, the process of forming the gate dielectric comprises thermally growing an oxide having a thickness of approximately 20 to 200 angstroms. In a preferred embodiment, the step of forming the conductive gate includes depositing polysilicon upon the gate dielectric and patterning the polysilicon with a photolithography process. In an alternative embodiment, the step of forming the conductive gate includes depositing aluminum upon the gate dielectric and patterning the aluminum with a photolithography process. In a presently preferred embodiment, the step of forming the gate insulator includes thermally oxidizing a topography cooperatively defined by the conductive gate and the gate dielectric such that a thickness of the gate insulator adjacent to the first and second sidewalls of the conductive gate is greater than a thickness of the gate insulator adjacent to the gate dielectric. The process of forming the gate insulator is then completed by etching back the gate insulator such that a thickness of the gate insulator over the lightly doped regions of the semiconductor substrate is greater than or equal to zero angstroms and less than approximately 50 angstroms. In one embodiment, the process further includes the step of forming first and second silicon nitride spacer structures in contact with the vertical portions of the gate insulator. Preferably, the step of forming the first and second source/drain structures includes the steps of chemically vapor depositing a polysilicon layer upon a topography defined by the conductive gate at an upper surface of the semiconductor substrate, introducing an impurity distribution into the polysilicon layer, and planarizing the polysilicon layer such that an upper surface of the polysilicon layer is level with or below an upper surface of the gate insulator above the conductive gate such that the first source/drain structure is physically separated from the second source/drain structure.

BRIEF DESCRIPTION OF THE DRAWINGS

Other objects and advantages of the invention will become apparent upon reading the following detailed description and upon reference to the accompanying drawings in which:

FIG. 7 is a processing step subsequent to FIG. 6 in which the nitrogen bearing dielectric layer has been etched to form a nitrogen bearing spacer structure on vertical portions of the gate insulator;

FIG. 8 is a processing step subsequent to FIG. 5 in which source/drain regions have been formed above an upper surface of the semiconductor substrate over the lightly doped regions of the substrate.

Figure 1:
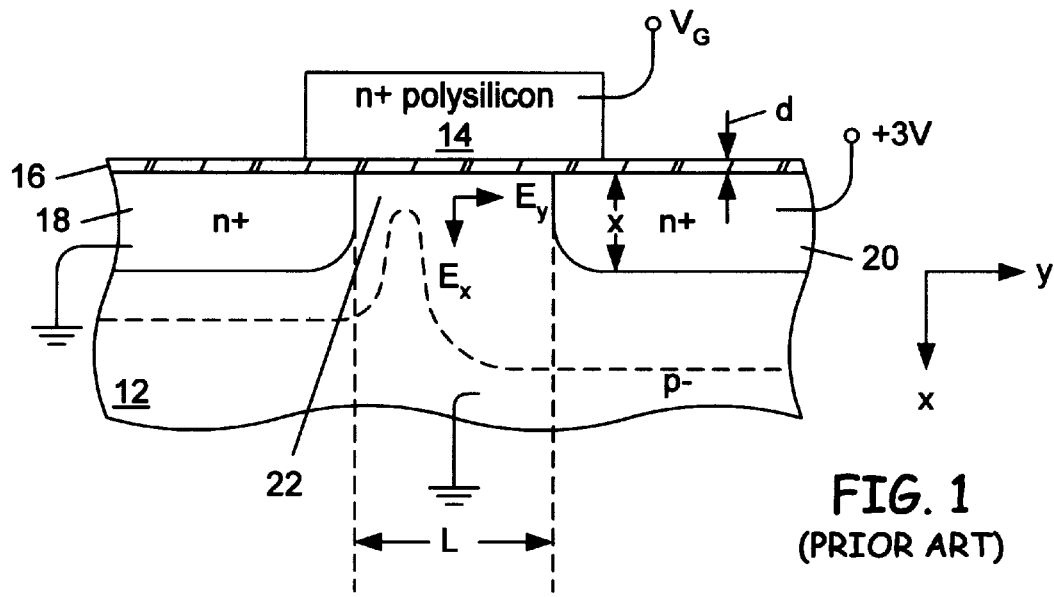
FIG. 1 is a cross-sectional view of an n-channel MOS transistor including implanted source/drain regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 8 discloses a transistor 100 featuring a shallow source/drain junction depth designed to minimize short channel effects in deep submicron transistors. Transistor 100 includes semiconductor substrate 102, which is preferably comprised of a single crystal silicon. Typical semiconductor substrates include a heavily doped (i.e., a dopant concentration greater than $1 \times 10^{19}$ atoms/cm$^3$) bulk region (not shown in the figure) upon which a lightly doped epitaxial layer has been formed. Preferably the epitaxial layer is a p-type silicon having a resistivity of approximately 10 to 15 $\Omega$ cm. Silicon substrate 102 includes an upper region 104. Upper region 104 of silicon substrate 102 includes a channel region 108 laterally displaced between a first and a second lightly doped region 106a and 106b respectively. The lightly doped regions 106 extend to a junction depth $x_j$ below upper surface 101 of semiconductor substrate 102. The first and second lightly doped regions 106a and 106b respectively contain a first and a second lightly doped impurity distribution represented in the figure as reference numerals 110a and 110b. In an n-channel embodiment of transistor 100, first and second lightly doped impurity distributions 110a and 110b preferably comprise a distribution of arsenic ions having a peak concentration of less than approximately $1 \times 10^{17}$ atoms/cm$^3$. In a p-channel embodiment, lightly doped impurity distributions 110 will preferably comprise ions of boron. It will be further appreciated to those skilled in the art that for a p-channel transistor, the p-minus epitaxial layer of semiconductor substrate 102 must be doped within an n-type impurity such as phosphorous or arsenic until the n-type impurity concentration dominates the electrical characteristics of channel region 108. As seen in FIG. 8, channel region 108 extends laterally from a position within semiconductor substrate 102 approximately coincident with a first sidewall 116a of conductive gate 114 to a position approximately coincident with second sidewall 116b of conductive gate 114. Channel region 108 is so named because application of an appropriate bias to conductive gate 114 will induce a conductive channel within channel region 108 such that first lightly doped region 106a and second lightly doped region 106b will be electrically coupled. In the case of an n-channel embodiment of transistor 100, an appropriate bias is typically positive whereas in a p-channel embodiment the appropriate bias is typically negative. The junction depth $x_j$ of lightly doped regions 106 is preferably less than approximately 0.1 microns. The depletion regions surrounding such a shallow junction will be significantly and desirably less than the lateral dimension of channel region 108 thereby minimizing short channel effects such as threshold voltage reduction for short channel devices.

Transistor 100 further includes a gate dielectric 112 formed on an upper surface of channel region 108 of semiconductor substrate 102. Conductive gate 114 is formed on gate dielectric 112 and includes a first sidewall 116a and a second side wall 116b. In preferred embodiments, gate dielectric 112 is a thermal oxide having a thickness of approximately 20 to 200 angstroms while conductive gate 114, in one embodiment, comprises heavily doped polysilicon (i.e., polysilicon having a sheet resistivity less than approximately 500 $\Omega$/square). In another embodiment, conductive gate 114 may comprise a metal such as copper, tungsten, or aluminum. Transistor 100 further includes gate insulator 118 formed in contact with first sidewall 116a and second sidewall 116b of conductive gate 114. Gate insulator 118 is preferably formed of an oxide having a thickness of approximately 200 to 1000 angstroms. In one embodiment the oxide may be a thermal oxide while, in another embodiment, the oxide may be a chemically vapor deposited. Gate insulator 118 physically separates conductive gate 114 from first and second source/drain structures 120a and 120b respectively. Source/drain structures 120 are formed above upper surface 101 of semiconductor substrate 102 over the lightly doped regions 106 of substrate 102. In one embodiment, source/drain structures 120 are in direct contact with lightly doped regions 106 of semiconductor substrate 102. Source/drain structures 120 are preferably heavily doped with an impurity such as phosphorous or arsenic in an n-channel embodiment or boron in a p-channel embodiment and provide a plentiful source of global carriers for conducting current from first lightly doped region 106a to second lightly doped region 106b when a channel is induced in channel region 108 of semiconductor substrate 102. In one p-channel embodiment of transistor 100, a thin dielectric layer may be present between lightly doped region 106 and source/drain structure 120. The presence of a thin dielectric layer will retard, but not prevent, diffusion of boron atoms from source/drain structure 120 to lightly doped region 106. Thus, the thin dielectric may help to achieve a shallow junction depth $x_j$ in a p-channel embodiment of transistor 100. For purposes of this disclosure, the thin dielectric referred to herein has a thickness of approximately 10 to 30 angstroms. This thin dielectric is represented in FIG. 8b as reference numeral 113. It is understood, however, that thin dielectric 113 is optional in a p-channel embodiment and is generally not present in an n-channel embodiment of transistor 100. Transistor 100 may further include silicon nitride spacers (not shown in FIG. 8) in contact with and extending away from vertical portions of the gate insulator. These silicon nitride spacers will, therefore, separate source/drain structures 120 from gate insulator 118 and may serve to further limit boron diffusion into conductive gate 114 in a p-channel embodiment of transistor 100.

Figure 2:
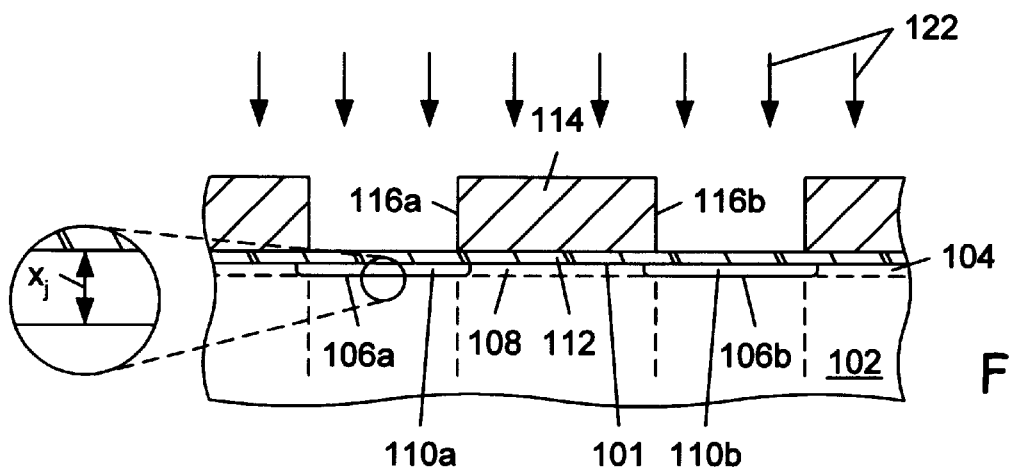
FIG. 2 is a partial cross-sectional view of a conductive gate formed on a gate dielectric formed over a channel region of a semiconductor substrate wherein the channel region is laterally displaced between a pair of lightly doped impurity regions.

Turning now to FIGS. 2 through 7, preferred and alternative processing sequences for forming transistor 100 are depicted. In FIG. 2, a conductive gate 114 has been formed upon a gate dielectric 112 which is, in turn, formed upon upper surface 101 of semiconductor substrate 102. Gate dielectric 112 is preferably formed by thermally oxidizing silicon substrate 102 in an oxygen bearing ambient as is well known in the field of semiconductor processing. A preferred thickness of gate dielectric 112 is approximately 20 to 200 angstroms. Subsequent to the formation of gate dielectric 112, conductive gate 114 is formed in contact with gate dielectric 112 over channel region 108 of semiconductor substrate 102. In one embodiment, conductive gate 114 comprises heavily doped polysilicon. In another embodiment, conductive gate 114 comprises a metal such as tungsten, aluminum, or copper. Conductive gate 114 is typically formed by depositing the appropriate material upon gate dielectric 112 and patterning the conductive layer using a conventional photolithography masking step. The deposition of the conductive material used to form the conductive gate 114 may include a chemical vapor deposition process such as is preferably used in an embodiment in which conductive gate 114 comprises heavily doped polysilicon. In embodiments in which conductive gate 114 comprises a metal, the deposition process may include a physical vapor deposition such as a sputtering technique using an appropriate target. Subsequent to the formation of conductive gate 114, a lightly doped impurity distribution 110 is introduced into lightly doped regions 106 of semiconductor substrate 102. In a preferred embodiment, the introduction of lightly doped impurity distribution 110 is accomplished with an ion implantation step represented in FIG. 2 by reference numeral 122. Ion implantation 122 is designed to achieve an extremely shallow junction depth $x_j$. In an n-channel embodiment, ion implantation 122 is preferably performed using an arsenic dose of less than $5 \times 10^{14}$ atoms/cm$^2$ at an implant energy of less than approximately 50 kev. For a p-channel embodiment, a boron or $BF_2$ implant is preferred and the implanted energy may be preferably further reduced to less than approximately 7 kev. The preferred embodiment results in a junction depth $x_j$ than is less than approximately 0.1 microns. Due to the presence of conductive gate 114, lightly doped impurity distribution 110 extends to approximately a boundary of channel region 108 within upper region 104 of semiconductor substrate 102. The shallow junction depth $x_j$ coupled with the relatively light doping concentration of impurity distribution 110 combined to minimize the short channel effects of transistor 100 when one of the source/drain structures is biased to a positive voltage.

Figure 3:
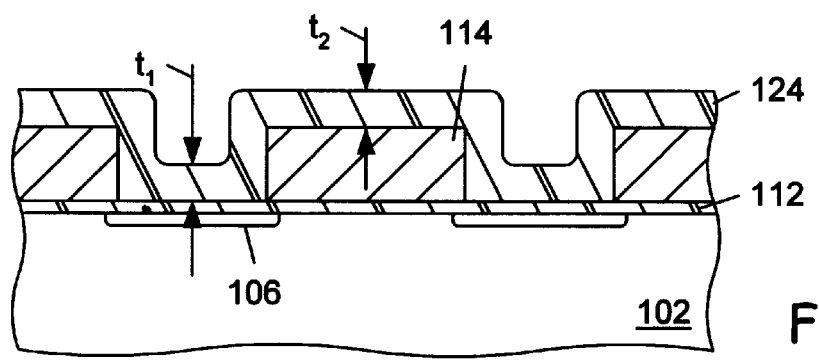
FIG. 3 is a processing step subsequent to FIG. 2 in which an insulator layer has been deposited upon the topography defined by the conductive gate and the gate dielectric.
Figure 4:
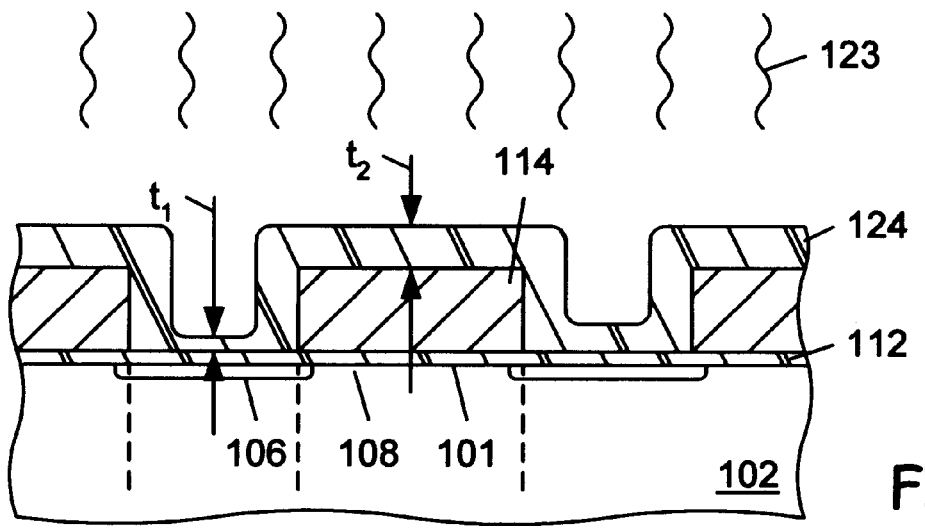
FIG. 4 is a processing step subsequent to FIG. 2 in which an insulator layer has been thermally grown over the conductive gate and gate dielectric.
Figure 5:
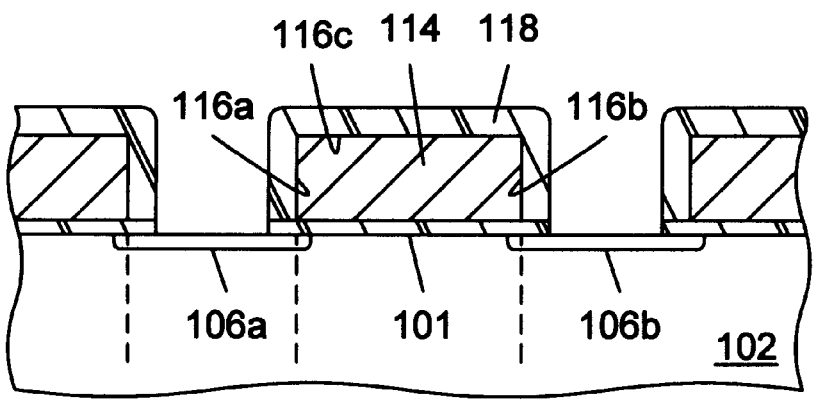
FIG. 5 is a processing step subsequent to FIG. 4 in which the insulator layer has been etched back to form a gate insulator.

FIGS. 3 and 4 depict alternative embodiments for forming an isolation structure around conductive gate 114. In FIG. 3 a dielectric layer 124 has been chemically vapor deposited upon the topography defined by conductive gate 114 and gate dielectric 112 resulting in a relatively uniform thickness film in which a first thickness $t_1$ of the dielectric layer 124 over lightly doped region 106 of semiconductor substrate 102 is approximately equal to a second thickness $t_2$ of dielectric layer 124 over an upper surface of conductive gate 114. In FIG. 4, dielectric 124 is formed with a thermal oxidation process represented in FIG. 4 as reference numeral 123. Due to the presence of gate dielectric 112 upon upper surface 101 of semiconductor substrate 102 the thermal oxidation process 123 results in a dielectric layer 124 having a first thickness to over lightly doped region 106 that is less than a second thickness $t_2$ that results over conductive gate 114. The first thickness $t_1$ because of the slower oxidation rate over portions of semiconductor substrate 102 covered by gate dielectric 112. It will be appreciated that in an embodiment in which dielectric material 124 is formed with thermal oxidation process 123, conductive gate 114 comprises polysilicon. In addition to being able to withstand the high temperatures associated with the thermal oxidation process, polysilicon is required to provide the silicon source necessary to grow the silicon-oxide film 124 over and adjacent to the sidewalls of conductive gate 114. FIG. 5 shows a processing step subsequent to FIG. 4 in which dielectric layer 124 has been etched back to produce a gate insulator 118. It will be appreciated that the etch back process, if performed upon the dielectric layer 124 shown in FIG. 4 will expose upper surface 101 of semiconductor substrate 102 over lightly doped region 106 before the dielectric layer is completely removed above an upper surface of conductive gate 114. With this technique, gate insulator 118 is in contact with a first sidewall 116a, a second sidewall 116b, and an upper surface 116c of conductive gate 114. If the dielectric layer 124 is of the uniform thickness type shown in FIG. 3, the etch back process may result in the simultaneous exposure of not only lightly doped regions 106 but also upper surface 116c of conductive gate 114. In either case, however, it is contemplated that gate insulator 118 will remain in contact with first sidewall 116a and second sidewall 116b of conductive gate 114 to separate conductive gate 114 from subsequently formed source/drain structures.

Figure 6:
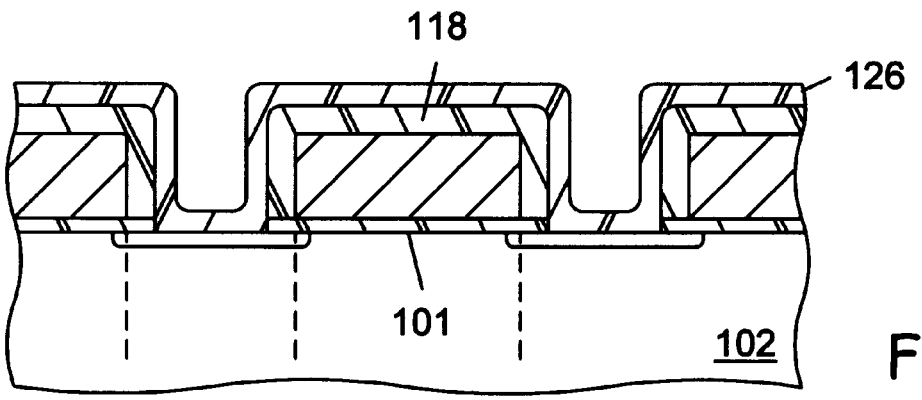
FIG. 6 is an optional processing step subsequent to FIG. 5 in which a nitrogen bearing dielectric layer has been formed over the gate insulators and the semiconductor substrate.

FIGS. 6 and 7 show an optional process sequence in which silicon nitride spacers are formed on vertical portions of gate insulator 118. In FIG. 6, a conformal silicon nitride layer 126 is deposited upon the topography defined by gate insulator 118 and upper surface 101 of semiconductor substrate 102. The conformal deposition of silicon nitride is preferably accomplished with a chemical vapor deposition process. A preferred thickness of the silicon nitride layer is approximately 200 to 1000 angstroms. Subsequent to the deposition of silicon nitride layer 126, an anisotropic silicon nitride etch is performed to produce silicon nitride spacers 128a and 128b formed on respective vertical sidewalls of gate insulator 118. As previously indicated, the presence of silicon nitride spacers 128 is optional and may provide additional reduction of boron penetration into conductive gate 114 and, from there, penetration into channel region 108. As will be appreciated to those skilled in semiconductor processing, penetration of boron into channel region 108 may result in an undesirable shift in threshold voltage for p-channel devices.

In FIG. 8, first and second source/drain structures 120a and 120b respectively are shown. The formation of source/drain structures 120 is preferably carried out by chemically vapor depositing a polysilicon layer upon the topography formed by gate insulator 118 and upper surface 101 of semiconductor substrate 100. Impurities are then introduced into the polysilicon preferably through the use of an ion implantation process. The polysilicon is preferably doped with phosphorous or arsenic in an n-channel embodiment of transistor 100 and boron in an p-channel embodiment of transistor 100. The implantation dose is preferably sufficient to reduce a sheet resistivity of source/drain structures 120 to less than approximately 500 Ω/square. First and second source/drain structures 120a and 120b are isolated from each other with a planarization process designed to remove portions of the polysilicon layer such that an upper surface of the polysilicon layer, in a preferred embodiment, is substantially planar with an upper surface of gate insulator 118. In an embodiment in which gate insulator 118 is not present upon upper surface 116c of conductive gate 114, the planarization process should result in source/drain structures having an upper surface substantially planar with upper surface 116 of conductive gate 114. The planarity of the upper surface of source/drain structures 120 is not critical to the present invention and the essential goal of the planarization process is to physically isolate first source/drain structure 120a from second source/drain structure 120b. It will be appreciated that the introduction of an impurity distribution into source/drain structures 120a and 120b may be alternatively accomplished prior to or subsequent to the planarization process.

It will be appreciated to those skilled in the art having the benefit of this disclosure that this invention is capable of producing a shallow junction transistor to minimize short channel effects in deep submicron transistors. It is also to be understood that the form of the invention shown and described is to be taken as exemplary, presently preferred embodiments. Various modification and changes may be made without departing from the spirit and scope of the invention as set forth in the claims. It is intended that the following claims be interpreted to embrace all such modifications and changes.

What is claimed is:

1. A transistor, comprising:
   a conductive gate over a gate dielectric on a semiconductor substrate;
   a first and a second lightly doped region within said semiconductor substrate and separated by a channel region beneath said conductive gate;
   a first and a second source/drain structure above an upper surface of said semiconductor substrate above said first and second lightly doped regions respectively, wherein said first and second source/drain structures are insulated from said conductive gate; and
   a dielectric layer extending completely across said first and second lightly doped regions in the area beneath said first and second source/drain structures respectively.

2. The transistor as recited in claim 1, wherein said dielectric layer is approximately 30 to 50 angstroms thick.

3. The transistor as recited in claim 1, wherein said dielectric layer is approximately 10 to 30 angstroms thick.

4. The transistor as recited in claim 1, further comprising an insulator between said first and second source/drain structures and respective first and second sidewalls of said conductive gate.

5. The transistor as recited in claim 4, wherein said first and second source/drain structures are substantially planar with an upper surface of said insulator.

6. The transistor as recited in claim 4, wherein said insulator extends over said conductive gate.

7. The transistor as recited in claim 4, wherein said insulator does not extend over an upper surface of said conductive gate.

8. The transistor as recited in claim 7, wherein said first and second source/drain structures are substantially planar with said upper surface of said conductive gate.

9. The transistor as recited in claim 4, wherein said insulator comprises an oxide.

10. The transistor as recited in claim 9, wherein said oxide is a thermal oxide in contact with said first and second sidewalls of said conductive gate respectively, wherein said thermal oxide is approximately 200 to 1000 angstroms thick.

11. The transistor as recited in claim 9, further comprising a first and a second silicon nitride spacer between said insulator and said first and second source/drain structures respectively.

12. The transistor as recited in claim 11, wherein said first and second silicon nitride spacers are approximately 200 to 1000 angstroms thick.

13. The transistor as recited in claim 1, wherein said first and second lightly doped regions and said first and second source/drain structures comprise a p-type dopant.

14. The transistor as recited in claim 1, wherein a junction depth of said first and second lightly doped regions is less than approximately 0.1 microns.

15. The transistor as recited in claim 1, where in a peak impurity concentration of said first and second lightly doped regions is less than approximately $1 \times 10^{17}$ atoms/cm$^3$.

16. The transistor as recited in claim 1, wherein said conductive gate comprises aluminum.

17. The transistor as recited in claim 1, wherein said first and said second source/drain structures comprise polysilicon and wherein said polysilicon includes a source/drain impurity distribution wherein a peak concentration of said source/drain impurity distribution is greater than approximately $1 \times 10^{19}$ atoms/cm$^3$.

18. A transistor, comprising:
    a conductive gate over a gate dielectric on a semiconductor substrate;
    a first and a second lightly doped region within said semiconductor substrate and separated by a channel region beneath said conductive gate;
    a first and a second source/drain structure above an upper surface of said semiconductor substrate above said first and second lightly doped regions respectively, wherein said first and second source/drain structures are insulated from said conductive gate; and
    a dielectric layer between said first and second lightly doped regions and said first and second source/drain structures respectively, wherein said dielectric layer is approximately 30 to 50 angstroms thick.

19. The transistor as recited in claim 18, further comprising an insulator between said first and second source/drain structures and respective first and second sidewalls of said conductive gate.

20. The transistor as recited in claim 19, wherein said insulator extends over said conductive gate, and wherein said first and second source/drain structures are substantially planar with an upper surface of said insulator.

21. The transistor as recited in claim 19, wherein said insulator does not extend over an upper surface of said conductive gate, and wherein said first and second source/drain structures are substantially planar with said upper surface of said conductive gate.

22. The transistor as recited in claim 19, wherein said insulator comprises a thermal oxide in contact with said first and second sidewalls of said conductive gate respectively, wherein said thermal oxide is approximately 200 to 1000 angstroms thick.

23. The transistor as recited in claim 19, further comprising a first and a second silicon nitride spacer between said insulator and said first and second source/drain structures respectively.

24. The transistor as recited in claim 18, wherein said first and second lightly doped regions and said first and second source/drain structures comprise a p-type dopant.

25. The transistor as recited in claim 18, wherein a junction depth of said first and second lightly doped regions is less than approximately 0.1 microns.

26. A transistor, comprising:
    a conductive gate over a gate dielectric on a semiconductor substrate;
    a first and a second lightly doped region within said semiconductor substrate and separated by a channel region beneath said conductive gate;
    a first and a second source/drain structure above an upper surface of said semiconductor substrate above said first and second lightly doped regions respectively, wherein said first and second source/drain structures are insulated from said conductive gate; and
    a dielectric layer between said first and second lightly doped regions and said first and second source/drain structures respectively, wherein said dielectric layer is approximately 10 to 30 angstroms thick.

27. The transistor as recited in claim 26, further comprising an insulator between said first and second source/drain structures and respective first and second sidewalls of said conductive gate.

28. The transistor as recited in claim 27, wherein said insulator extends over said conductive gate, and wherein said first and second source/drain structures are substantially planar with an upper surface of said insulator.

29. The transistor as recited in claim 27, wherein said insulator does not extend over an upper surface of said conductive gate, and wherein said first and second source/drain structures are substantially planar with said upper surface of said conductive gate.

30. The transistor as recited in claim 27, wherein said insulator comprises a thermal oxide in contact with said first and second sidewalls of said conductive gate respectively, wherein said thermal oxide is approximately 200 to 1000 angstroms thick.

31. The transistor as recited in claim 27, further comprising a first and a second silicon nitride spacer between said insulator and said first and second source/drain structures respectively.

32. The transistor as recited in claim 26, wherein said first and second lightly doped regions and said first and second source/drain structures comprise a p-type dopant.

33. The transistor as recited in claim 26, wherein a junction depth of said first and second lightly doped regions is less than approximately 0.1 microns.

34. A shallow junction MOS transistor, comprising:

a semiconductor substrate wherein an upper region of said semiconductor substrate comprises a first and a second lightly doped region laterally displaced on either side of a channel region of said semiconductor substrate, wherein said first and second lightly doped regions extend to a junction depth below said upper surface of said semiconductor substrate;

a first and a second lightly doped impurity distribution located within said first and second source/drain regions respectively of said semiconductor substrate;

a gate dielectric formed on an upper surface of said channel region of said semiconductor substrate;

a conductive gate formed on said gate dielectric wherein said conductive gate includes a first and a second sidewall;

a gate insulator formed in contact with said first and second sidewalls of said conductive gate;

a first and a second source/drain structure formed above said upper surface of said semiconductor surface laterally displaced over said first and second lightly doped regions of said semiconductor substrate respectively; and a source/drain dielectric extending completely across the interface between said first and second source/drain structures and said first and said lightly doped regions respectively.

35. The transistor of claim 34 wherein said semiconductor substrate comprises single crystal silicon wherein a resistivity of said silicon is approximately 10 to 15 $\Omega$-cm.

36. The transistor of claim 34 wherein said junction depth is less than approximately 0.1 microns.

37. The transistor of claim 34 wherein said channel region extends laterally from a position within said semiconductor substrate upper surface approximately coincident with a lateral position of said first sidewall of said conductive gate to a position approximately coincident with a lateral position of said second sidewall of said conductive gate.

38. The transistor of claim 34 wherein a peak concentration of said first and second lightly doped impurity distribution is less than approximately $1 \times 10^{17}$ atoms/cm$^3$.

39. The transistor of claim 34 wherein said first and second lightly doped impurity distributions comprise boron.

40. The transistor of claim 34 wherein said gate dielectric comprises a thermal oxide and further wherein a thickness of said thermal oxide is approximately 20 to 200 angstroms.

41. The transistor of claim 34 wherein said conductive gate comprises heavily doped polysilicon such that a sheet resistivity of said polysilicon is less than approximately 500 $\Omega$/square.

42. The transistor of claim 34 wherein said conductive gate comprises aluminum.

43. The transistor of claim 34 wherein said gate insulator comprises a thermal oxide and wherein a thickness of said thermal oxide is approximately 200 to 1000 angstroms.

44. The transistor of claim 34 wherein said first and said second source/drain structures comprises polysilicon and wherein said polysilicon includes a source/drain impurity distribution wherein a peak concentration of said source/drain impurity distribution is greater than approximately $1 \times 10^{19}$ atoms/cm$^3$.

45. The transistor of claim 34, wherein a thickness of said source/drain dielectric is between approximately 30 to 50 angstroms.

46. The transistor of claim 34 further comprising a first and a second silicon nitride spacer in contact with and extending laterally away from said a first and second sidewall of said gate insulator, wherein a thickness of said first and second silicon nitride spacers is approximately 200 to 1000 angstroms.

* * * * *